United States Patent
Lee et al.

(10) Patent No.: US 7,279,931 B2
(45) Date of Patent: Oct. 9, 2007

(54) HIGH VOLTAGE TOLERANCE OUTPUT STAGE

(75) Inventors: Chao-Cheng Lee, Hsin-Chu (TW);
Yung-Hao Lin, Miao-Li Hsien (TW);
Wen-Chi Wang, Yun-Lin Hsien (TW);
Jui-Yuan Tsai, Tai-Nan (TW)

(73) Assignee: Realtek Semiconductor Corp., HsinChu (TW)

( * ) Notice: Subject to any disclaimer, the term of this patent is extended or adjusted under 35 U.S.C. 154(b) by 112 days.

(21) Appl. No.: 11/162,001

(22) Filed: Aug. 25, 2005

(65) Prior Publication Data

US 2006/0044015 A1    Mar. 2, 2006

(30) Foreign Application Priority Data

Aug. 26, 2004    (TW) ................. 93125510 A

(51) Int. Cl.
    *H03K 19/0175* (2006.01)
(52) U.S. Cl. .................. 326/81; 326/83; 257/370; 257/371
(58) Field of Classification Search ........... 257/370, 257/371; 326/81, 83
    See application file for complete search history.

(56) References Cited

U.S. PATENT DOCUMENTS

| | | | |
|---|---|---|---|
| 5,151,619 A | 9/1992 | Austin et al. | |
| 5,424,659 A | 6/1995 | Stephens et al. | |
| 5,804,998 A | 9/1998 | Cahill et al. | |
| 5,929,667 A | 7/1999 | Abadeer et al. | |
| 6,031,394 A | 2/2000 | Cranford, Jr. et al. | |
| 6,150,844 A | 11/2000 | Campardo | |
| 6,163,218 A * | 12/2000 | Hashimoto et al. | 330/257 |
| 6,198,316 B1 | 3/2001 | Krolak et al. | |
| 6,593,799 B2 | 7/2003 | De | |
| 6,759,872 B2 | 7/2004 | Lai | |
| 6,759,875 B2 * | 7/2004 | Mano et al. | 326/95 |
| 2002/0030533 A1* | 3/2002 | De et al. | 327/534 |
| 2005/0139931 A1* | 6/2005 | Arai | 257/370 |

OTHER PUBLICATIONS

Anne-Johan Annema, et al. "Designing Outside Rail Constraints.", 2004 IEEE International Solid-State Circuits Conference, Feb. 17, 2004, pp. 134-135, Session 7.
Annema. A, Geelen. G., De Jong. P., "5.5-V HO In a 2.5-V 0.25-um CMOS Technology.", IEEE Journal of Solid-State Circuits, Mar. 2001, pp. 528-538, vol. 36, No. 3.
Serneels, B. et al. "A High-Voltage Output Driver In a Standard 2.5V 0.25um CMOS Technology,", 2004 IEEE International Solid-State Circuits Conference, Feb. 17, 2004, pp. 146-147, Session 7.

* cited by examiner

*Primary Examiner*—Vibol Tan
(74) *Attorney, Agent, or Firm*—Winston Hsu

(57) ABSTRACT

An output stage structure includes first and second PMOS transistors and first and second NMOS transistors, wherein the MOS transistors are manufactured with a twin well process. The first PMOS transistor has a source coupled to a supply voltage (VDD), and a gate coupled to the first voltage. The second PMOS transistor has a source coupled to a drain of the first PMOS transistor, a gate coupled to the second voltage, and a drain coupled to an output pad. The first NMOS transistor has a drain coupled to the output pad, and a gate coupled to the third voltage. The second NMOS transistor has a drain coupled to source of the first NMOS transistor, a gate coupled to the fourth voltage, and a source coupled to ground.

15 Claims, 5 Drawing Sheets

HIGH VOLTAGE TOLERANCE OUTPUT STAGE

BACKGROUND OF THE INVENTION

1. Field of the Invention

The invention relates to an output stage structure, and more particularly, to a complementary MOS transistor output structure with high voltage tolerance.

2. Description of the Prior Art

As technology develops, the design of metal oxide semiconductor (MOS) transistor has also been moving toward the direction of smaller size, higher speed, lower power consumption, and lower supply voltage. Along with the development of a core circuit, a lower supply voltage is also utilized for increasing the circuit reliability. For instance, 0.5 um technology is utilized with 5V supply voltage for fabricating a core circuit whereas 0.25 um technology is utilized with 0.25V supply voltage for fabricating a core circuit. Nevertheless, the supply voltage of interface or peripheral circuits, due to the specification requirement, is often not decreased along with core circuit. For example, a transistor-transistor logic (TTL) interface of a digital circuit may require a 3.3V input/output voltage, a class D amplifier of a analog circuit may require a 12V MOS switch voltage, and a line driver may often require a 12V supply voltage for achieving the power transmission etc.

Traditionally, high voltage circuits often require high voltage tolerance devices that are capable of carrying out normal operations under high voltage conditions as well as maintaining a relatively long lifetime. Nevertheless, the fabrication of these high voltage tolerance devices often requires an additional high voltage fabrication process and also brings a disadvantage to the integration of interface circuit and core circuit. In recent years, numerous methods without utilizing high voltage tolerance devices for output stage applications have been widely discussed, such as the "5.5-V I/O in a 2.5-V 0.25-um CMOS Technology" disclosed in "IEEE Journal of Solid-State Circuits, vol. 36, no. 3, March 2001", or "A High-Voltage Output Driver in a Standard 2.5V 0.25 um CMOS Technology" disclosed in "2004 IEEE International Solid-State Circuit Conference, Session 7, TD: Scaling Trends, 7.8", and "Designing Outside Rail Constraints" disclosed in "2004 IEEE International Solid-State Circuit Conference, Session 7, TD: Scaling Trends, 7.2".

Please refer to FIG. 1. FIG. 1 is a perspective diagram showing the high voltage tolerance output stage according to the prior art, which can be applied to digital output or analog signals. As shown in FIG. 1, a plurality of MOS transistors 102, 104 use cascode connection for lowering the voltage difference. In other words, the voltage across any two points of all the MOS transistors 102, 104 is controlled to be less than the supply voltage (VDD, nom) of normal core circuit by utilizing an appropriate bias circuit 106. In general, the core circuit fabricated by 0.25 μm technology under 2.5V supply voltage (VDD, nom) is capable of tolerating 5V voltage at output stage.

Please refer to FIG. 2. FIG. 2 is a cross-section diagram showing the structure of the high voltage tolerance output stage according to the prior art, in which the structure is a cascode complementary MOS transistor. As shown in FIG. 2, an n well 302 is formed within a p substrate 304, in which a plurality of p+ dopants 306 is formed on top of the n well 302 for forming the source and drain of the PMOS transistor and a plurality of n+ dopants 308 is formed on top of the p substrate 304 for forming the source and drain of the NMOS transistor. The source and drain situated in proximity to the PMOS or NMOS itself transistors are coupled with each other, and the source and drain in between the PMOS and NMOS transistors are not only coupled with each other, but are also coupled to an output pad 314. The gate 318 of the PMOS transistor and the gate 320 of the NMOS transistor are coupled to a bias circuit 316 for controlling the output stage. Hence the voltage across any two points will be controlled to be less than the supply voltage (VDD, nom) of a normal core circuit under any circumstances.

Since all PMOS transistors from the high voltage tolerance output stage structure shown in FIG. 2 utilize the same n well 302 and all NMOS transistors utilize the same p substrate 304, it is unattainable to control the body bias voltage of each NMOS or PMOS individually. The condition will become worse when the supply voltage (VDD) of output stage (such as under the condition of a line driver at 12V) increases, and as the voltage of the output pad 314 exceeds a certain voltage limitation, a junction breakdown or junction leakage will occur on the junction structure of the n well 302 or the p substrate 304. In general, the junction breakdown voltage is approximately 8V to 10V for devices fabricated by the 0.25 um technology.

SUMMARY OF THE INVENTION

It is therefore an objective of the present invention to provide a high voltage tolerance output stage utilizing a twin well process (n well and deep n well) for increasing the supply voltage (VDD)

According to the present invention, a complementary MOS transistor output stage structure comprises: at least one PMOS transistor, wherein the PMOS transistor is coupled to a supply voltage and an output pad; a first NMOS transistor, wherein the NMOS transistor includes a first drain, a first gate, a first source, and a first body points, where the first drain is coupled to the output pad, and the first gate is coupled to a first reference voltage; and a second NMOS transistor, wherein the NMOS transistor includes a second drain, a second gate, a second source, and a second body points, where the second drain is coupled to the first source, the second gate is coupled to a second reference voltage, and the second source is coupled to the ground; among which, the PMOS and NMOS transistors together form a twin well structure.

The skill of isolating the global p well into pluralities of the local p wells by deep n well process has the advantage that every local p well has their suitable reference voltage generated by bias circuit to prevent form the junction breakdown and junction linkage at output stage. Additionally, the output stage circuit can be implemented by twin well process without using special high tolerance process.

These and other objectives of the present invention will no doubt become obvious to those of ordinary skill in the art after reading the following detailed description of the preferred embodiment that is illustrated in the various figures and drawings.

DETAILED DESCRIPTION

The high voltage tolerance output stage of the present invention is fabricated by a twin well process, hence each NMOS transistor or PMOS transistor has its own well and as a result, end users are able to apply reference voltage onto the well points accordingly to prevent overly large voltage difference between PN junction thereby causing junction breakdown and junction linkage.

Figure 1:
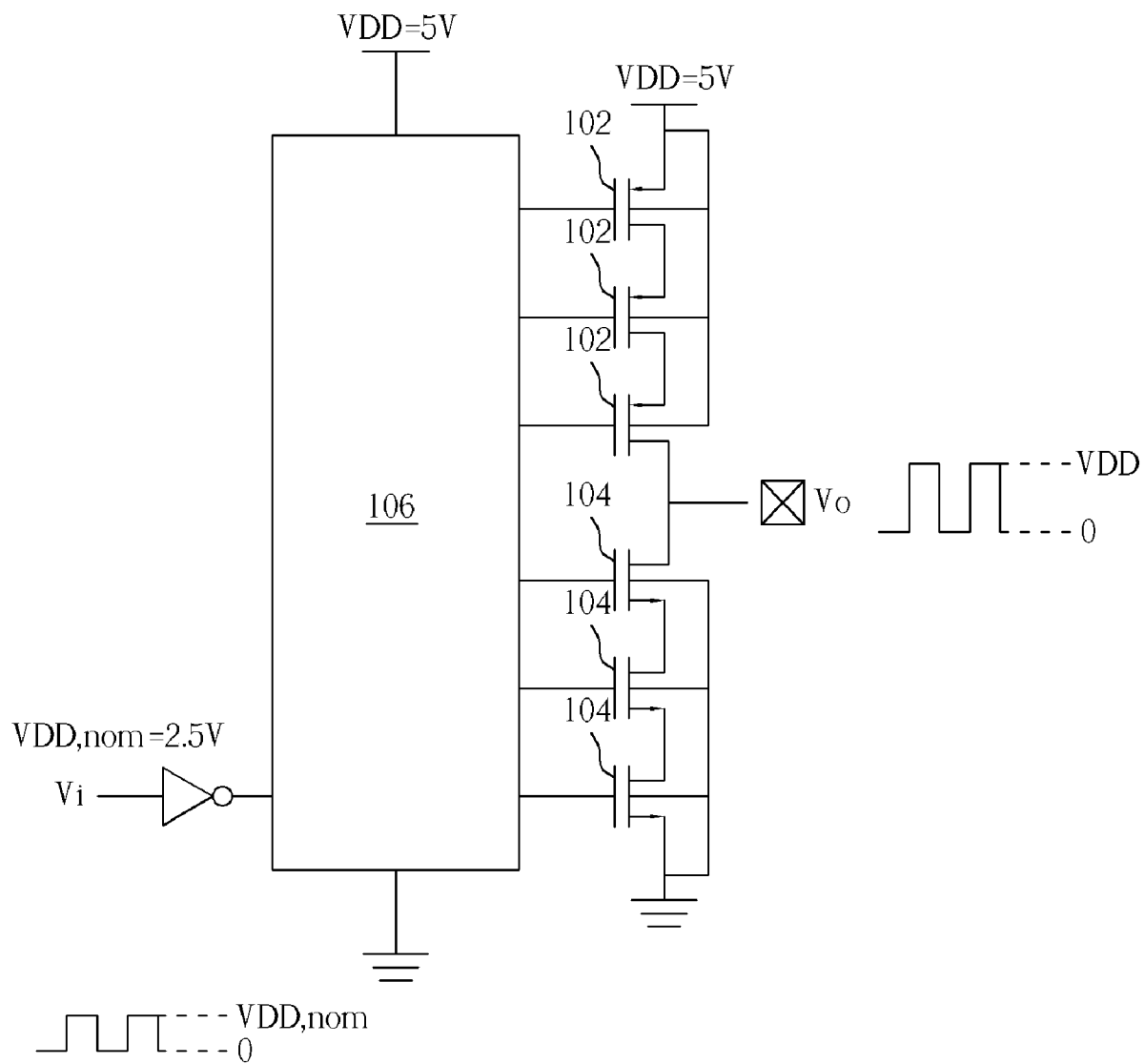
FIG. 1 is a perspective diagram showing the high voltage tolerance output stage according to the prior art.
Figure 2:
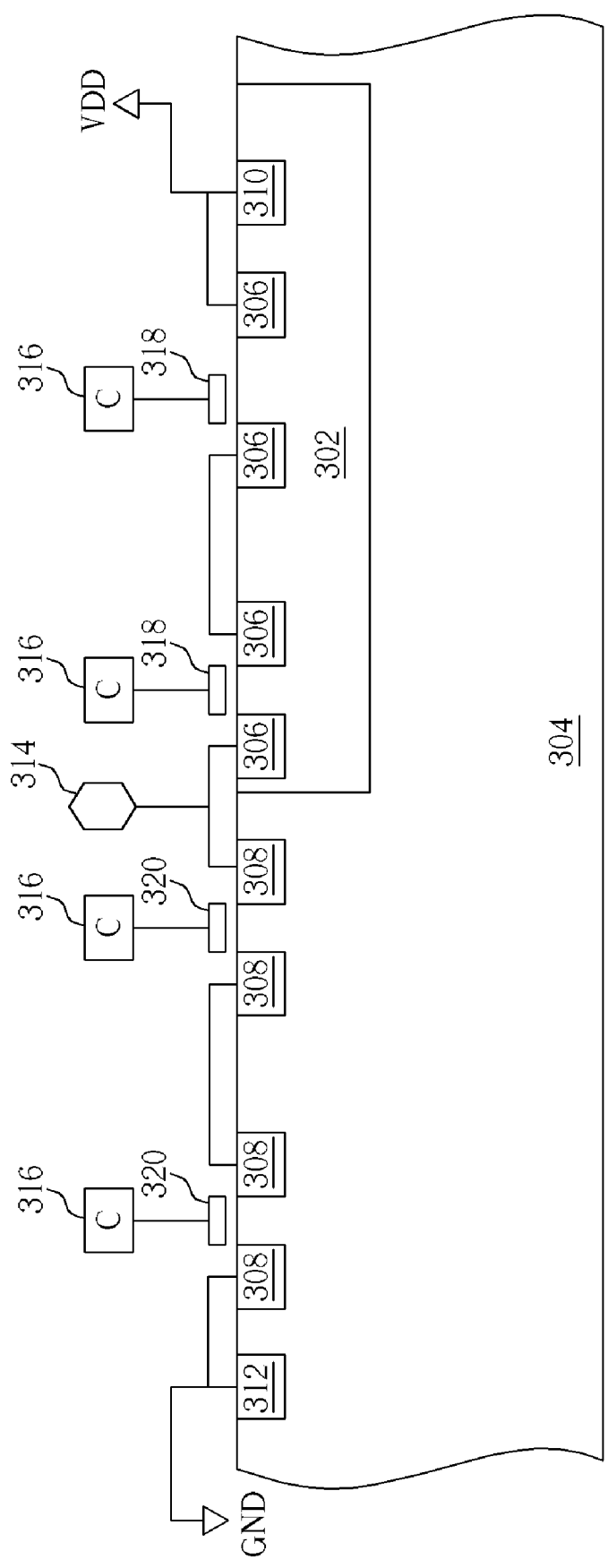
FIG. 2 is a cross-section diagram showing the structure of the high voltage tolerance output stage according to the prior art.
Figure 3:
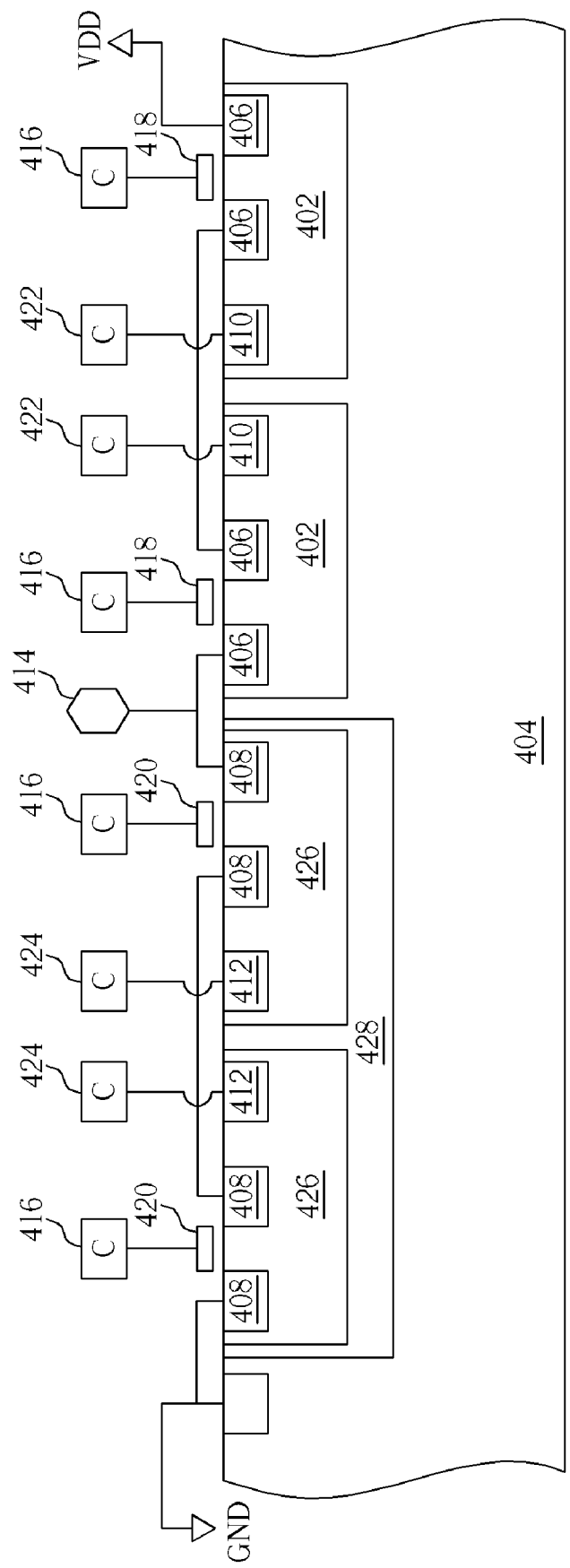
FIG. 3 is a cross-section diagram showing the structure of the high voltage tolerance output stage according to the present invention.

Please refer to FIG. 3. FIG. 3 is a cross-section diagram showing the structure of the high voltage tolerance output stage according to the present invention. As shown in FIG. 3, a twin well process is utilized to fabricate a plurality NMOS transistors and PMOS transistors on the p substrate 404. A plurality of n wells 402 separated from each other is disposed on the p substrate 404, in which two p+ dopants 406 are formed on top of each n well 402 for forming the source and drain of the PMOS transistor. In addition, a plurality of p wells 426 is disposed on the p substrate 404, in which a deep n well 428 separating the p well 426 of NMOS transistors is formed in between the p well 426 and the p substrate 404. Two n+ dopants 408 are formed on top of the p well 426 for forming the source and drain of the NMOS transistor.

The source and drain situated in proximity to the PMOS or NMOS transistors itself are coupled with each other whereas the drain in between the PMOS transistor and NMOS transistor is not only coupled together, but also coupled to an output pad 414. The gate 418 of the PMOS transistor and the gate 420 of the NMOS transistor are coupled to a bias circuit 416 for controlling the output stage, so that the voltage across any two points of the gate insulation layer will be controlled to be less than the supply voltage (VDD, nom) of a normal core circuit under any circumstances. Since the output stage structure of the present invention is fabricated by the twin well process that includes two independent wells, the well 410 of the PMOS transistor and the well 412 of the NMOS transistor can be coupled to a bias circuit 422 or 424 to ensure that the voltage across the source and drain of each PMOS and NMOS is controlled to be less than the supply voltage (VDD, nom) of normal core circuit under all operational conditions.

According to the present invention, it should be noted that the number of cascode transistors is not limited to the one shown in FIG. 3. When the high voltage tolerance output stage of the present invention is utilized, the reference voltage 416 coupled to the gate 418, 420 and/or the reference voltage 422, 424 coupled to the well point 410, 412 can be generated by a dynamic control circuit. This dynamic control circuit is capable of detecting the output voltage of the output pad 414 and controlling the voltage of the well points 410, 412 and/or the gate 418, 420. Consequently, the voltage across any two end points of the MOS transistors is controlled to be less than the supply voltage of the normal core circuit under all operational conditions. Also, the well point 410 of the PMOS transistor and the well point 412 of the NMOS transistor can not only coupled to the bias circuit 422, 424, but also couple to the source of the MOS transistor itself. Hence, this cascode structure with separating global well into local well, and giving a suitable reference voltage to gate and well can overcome the limitation of the junction breakdown voltage at output stage.

Figure 4:
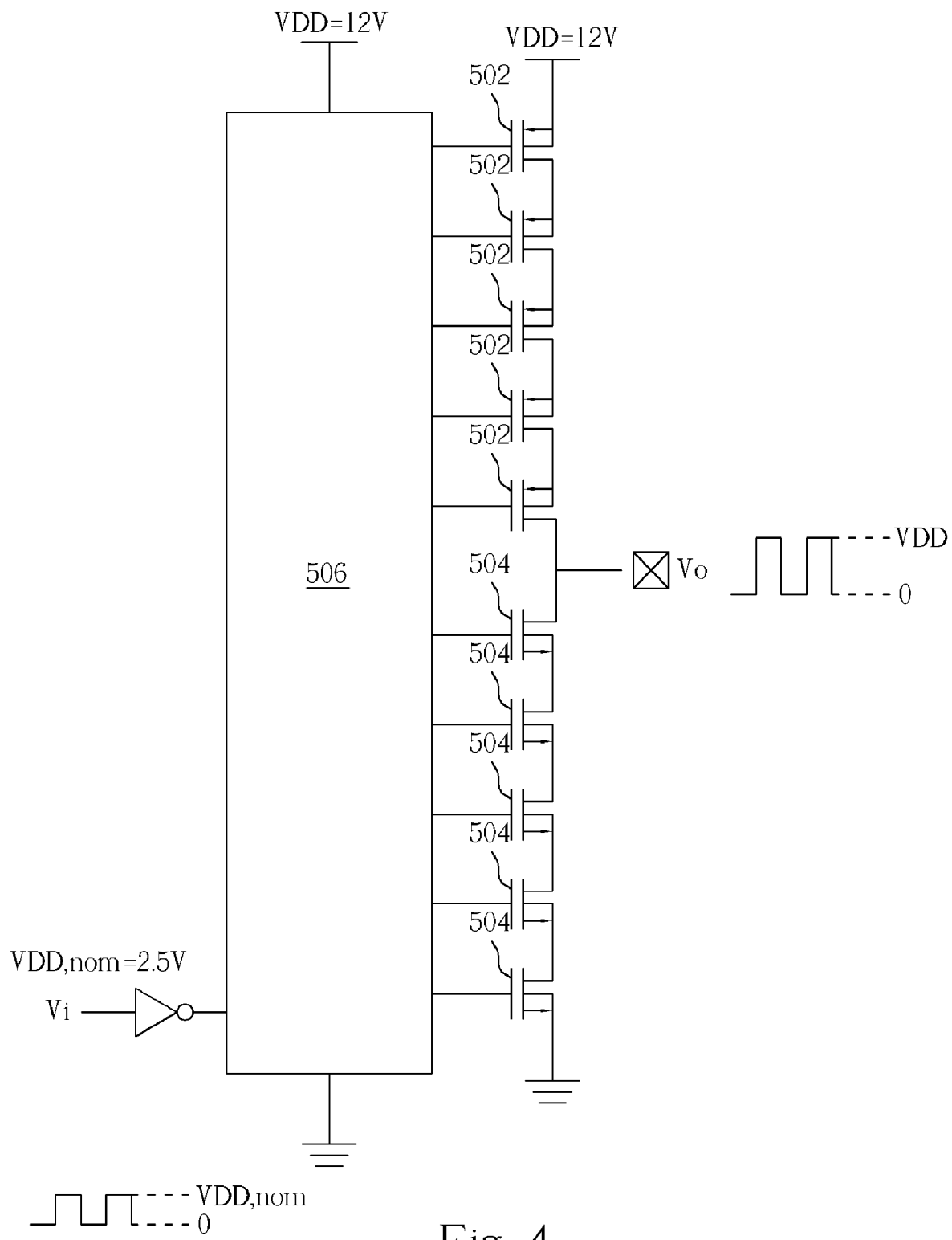
FIG. 4 is a perspective diagram showing the first application of the high voltage tolerance output stage of FIG. 3.
Figure 5:
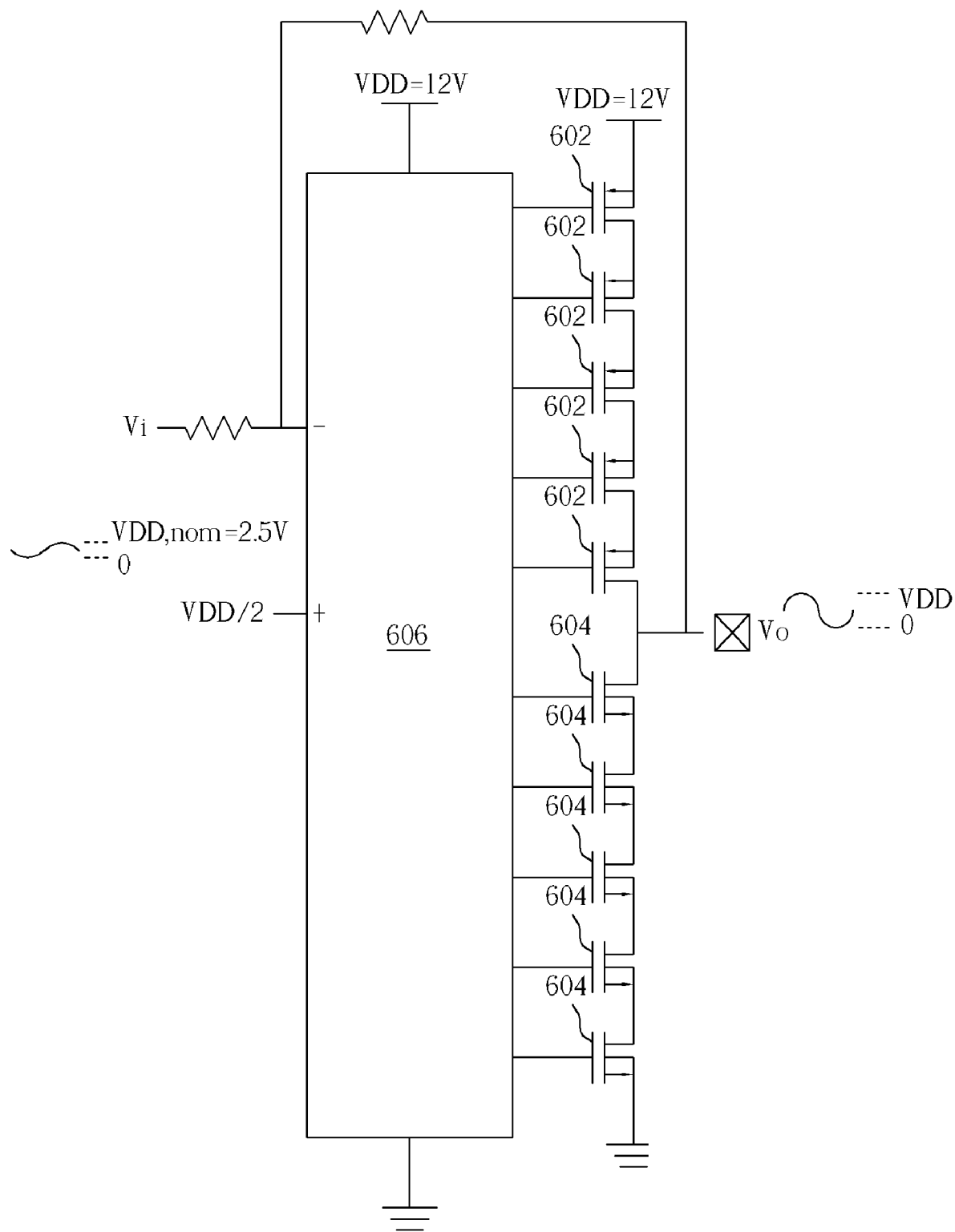
FIG. 5 is a perspective diagram showing the second application of the high voltage tolerance output stage of FIG. 3.

Please refer to FIG. 4 and FIG. 5. FIG. 4 and FIG. 5 are perspective diagrams showing the applications of the high voltage tolerance output stage of FIG. 3, where FIG. 4 shows a digital output stage circuit and FIG. 5 shows an analog output stage circuit. As shown in FIG. 4, a plurality of MOS transistors 502, 504 is a cascode connection. Next, the voltage across any two points of all the MOS transistors 502, 504 is controlled to be less than the supply voltage (VDD, nom) of the normal core circuit by a bias circuit 506 under all operational conditions. As shown in FIG. 5, a plurality of MOS transistors 602, 604 of the analog circuit is also connected by a cascode connection, and the voltage across any two points of all the MOS transistors 602, 604 is controlled to be less than the supply voltage (VDD, nom) of normal core circuit by a bias circuit 606 under all operational conditions. Evidently, the output stage structure shown in FIG. 4 and FIG. 5 can apply a reference voltage to the well point of the MOS transistors (or as shown in the figures, connect separately to each individual source), thereby overcoming the limitation of the junction breakdown voltage. Next, the number of transistors in the cascode connection can be increased gradually for increasing the work voltage, such as the 12V example shown in the FIG. 4 and FIG. 5.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A complementary MOS transistor output stage structure comprising:

a first PMOS transistor, wherein the first PMOS transistor including a first source, a first gate, a first drain, and a first body point, where the first source is coupled to a supply voltage, and the first gate is coupled to a first reference voltage;

a second PMOS transistor, wherein the second PMOS transistor including a second source, a second gate, a second drain, and a second body point, where the second source is coupled to the first drain, the second gate is coupled to a second reference voltage, and the second drain is coupled to an output pad;

a first NMOS transistor, wherein the first NMOS transistor including a third drain, a third gate, a third source, and a third body point, where the third drain is coupled to the output pad, and the third gate is coupled to a third reference voltage; and a second NMOS transistor, wherein the second NMOS transistor including a fourth drain, a fourth gate, a fourth source, and a fourth body point, where the fourth drain is coupled to the third source, the fourth gate is coupled to a fourth reference voltage, and the fourth source is coupled to the ground;

wherein the first body point is coupled to a fifth reference voltage, the second body point is coupled to a sixth reference voltage; the fifth reference voltage and the sixth reference voltage are different from each other; and the PMOS and NMOS transistors are formed in a twin well structure.

2. The complementary MOS transistor output stage structure of claim 1, where at least one PMOS transistor is coupled between the first drain and the second source.

3. The complementary MOS transistor output stage structure of claim 1, where at least one NMOS transistor is coupled between the third source and the fourth drain.

4. The complementary MOS transistor output stage structure of claim 1, wherein the twin well structure is comprised of a deep n well and a plurality of the local n wells disposed on top of the p substrate, in which a plurality of the local p wells are separated by the deep n well and disposed on top of the deep n well.

5. The complementary MOS transistor output stage structure of claim 1, wherein the first, second, third and fourth reference voltages are provided by a bias circuit.

6. The complementary MOS transistor output stage structure of claim 1, wherein the first body point is coupled to the first source and the second body point is coupled to the second source.

7. The complementary MOS transistor output stage structure of claim 1, wherein the third body point is coupled to a seventh reference voltage, a fourth body point is coupled to a eighth reference voltage, and the seventh reference voltage and the eighth reference voltage are different from each other.

8. The complementary MOS transistor output stage structure of claim 1, wherein the third body point is coupled to the third source and the fourth body point is coupled to the fourth source.

9. A complementary MOS transistor output stage structure comprising:
   at least one PMOS transistor, wherein the PMOS transistor is coupled to a supply voltage and an output pad;
   a first NMOS transistor, wherein the NMOS transistor including a first drain, a first gate, a first source, and a first body point, where the first drain is coupled to the output pad, the first gate is coupled to a first reference voltage; and
   a second NMOS transistor, wherein the NMOS transistor including a second drain, a second gate, a second source, and a second body point, where the second drain is coupled to the first source, the second gate is coupled to a second reference voltage, and the second source is coupled to the ground;
   wherein the first body point is coupled to a third reference voltage, the second body point is coupled to a fourth reference voltage: the third reference voltage and the fourth reference voltage are different from each other; and the PMOS and NMOS transistors are formed in a twin well structure.

10. The complementary MOS transistor output stage structure of claim 9, where at least one NMOS transistor is coupled between the first source and the second drain.

11. The complementary MOS transistor output stage structure of claim 9, wherein the twin well structure is comprised of a deep n well and a plurality of the local n wells disposed on top of the p substrate, in which a plurality of the local p wells are separated by the deep n well and disposed on top of the deep n well.

12. The complementary MOS transistor output stage structure of claim 9, wherein the first body point is coupled to the first source and the second body point is coupled to the second source.

13. A complementary MOS transistor output stage structure comprising:
   at least one PMOS transistor, wherein the PMOS transistor is coupled to a supply voltage and an output pad;
   a first NMOS transistor, wherein the NMOS transistor including a first drain, a first gate, a first source, and a first body point, where the first drain is coupled to the output pad and the first gate is coupled to a first reference voltage; and
   a second NMOS transistor, wherein the NMOS transistor including a second drain, a second gate, a second source, and a second body point, where the second drain is coupled to the first source, the second gate is coupled to a second reference voltage, and the second source is coupled to the ground;
   wherein the first body point is coupled to a third reference voltage; the second body point is coupled to a fourth reference voltage; the third reference voltage and the fourth reference voltage are different from each other;
   the first NMOS transistor is located within a first p well, the second NMOS transistor is located within a second p well, and the first p well and the second p well are both located within a deep n well and are separated from each other.

14. The complementary MOS transistor output stage structure of claim 13, where at least one NMOS transistor is coupled between the first source and the second drain.

15. The complementary MOS transistor output stage structure of claim 13, wherein the first body point is coupled to the first source and the second body point is coupled to the second source.

* * * * *